(12) United States Patent
Iwamizu (10) Patent No.: US 11,070,127 B2
(45) Date of Patent: Jul. 20, 2021

(54) SEMICONDUCTOR DEVICE (71) Applicant: FUJI ELECTRIC CO., LTD., Kawasaki (JP)

(72) Inventor: Morio Iwamizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/620,176

(22) Filed: Feb. 11, 2015

(65) Prior Publication Data

US 2015/0263611 A1   Sep. 17, 2015

(30) Foreign Application Priority Data

Mar. 13, 2014 (JP) ................. JP2014-050501

(51) Int. Cl.
| | |
|---|---|
| H02M 3/07 | (2006.01) |
| H03K 17/687 | (2006.01) |
| H02M 1/088 | (2006.01) |
| H02M 1/32 | (2007.01) |

(52) U.S. Cl.
CPC ............ H02M 3/07 (2013.01); H02M 1/088 (2013.01); H03K 17/687 (2013.01); *H02M 2001/327* (2013.01)

(58) Field of Classification Search
CPC .......................... H03K 17/145; H03K 17/687
USPC .................................................. 327/512, 513
See application file for complete search history.

(56) References Cited

U.S. PATENT DOCUMENTS

| | | | | |
|---|---|---|---|---|
| 5,187,632 A | * | 2/1993 | Blessing | .......... H03K 17/08122 |
| | | | | 257/341 |
| 5,227,655 A | * | 7/1993 | Kayama | .............. H01L 27/0688 |
| | | | | 257/327 |
| 5,432,471 A | | 7/1995 | Majumdar et al. | |
| 5,977,814 A | * | 11/1999 | Ishii | ..................... H03K 17/168 |
| | | | | 327/108 |
| 6,271,708 B1 | * | 8/2001 | Hoshi | ................... H03K 17/164 |
| | | | | 327/377 |
| 6,285,235 B1 | * | 9/2001 | Ichikawa | ........... H03K 17/0406 |
| | | | | 326/17 |
| 7,671,662 B2 | * | 3/2010 | Lui | ..................... H01L 27/0255 |
| | | | | 327/513 |
| 8,531,170 B2 | | 9/2013 | Fukami et al. | |

(Continued)

FOREIGN PATENT DOCUMENTS

| | | |
|---|---|---|
| JP | S62252972 A | 11/1987 |
| JP | H06-151844 A | 5/1994 |

(Continued)

*Primary Examiner* — Lincoln D Donovan
*Assistant Examiner* — Colleen J O Toole
(74) *Attorney, Agent, or Firm* — Rabin & Berdo, P.C.

(57) ABSTRACT

A semiconductor device that compensates for imbalance between a plurality of semiconductor elements connected in parallel by negative feedback to achieve current balance utilizing reversed temperature characteristics without providing any dedicated element just for cancelling temperature characteristics. A gate driving circuit turns ON a power semiconductor element by applying a voltage elevated by a charge pump (CP) circuit to a gate through a resistor connected between the CP circuit and the gate. The power semiconductor element is turned OFF by control circuit that gives a control signal to turn ON a MOS switch in the gate driving circuit and discharges the gate through a diode.

18 Claims, 8 Drawing Sheets

(56) References Cited

U.S. PATENT DOCUMENTS

| | | | | |
|---|---|---|---|---|
| 8,963,585 B2* | 2/2015 | Lobsiger | ............... | H02M 1/088 |
| | | | | 327/108 |
| 9,041,437 B2* | 5/2015 | Daigo | .................... | H03K 17/14 |
| | | | | 327/108 |
| 2010/0039364 A1* | 2/2010 | Lee | ...................... | G09G 3/3696 |
| | | | | 345/100 |

FOREIGN PATENT DOCUMENTS

| | | |
|---|---|---|
| JP | H07-22515 A | 1/1995 |
| JP | H10-327056 A | 12/1998 |
| JP | 2001-177114 A | 6/2001 |
| JP | 2003-319638 A | 11/2003 |
| JP | 2008-042317 A | 2/2008 |
| JP | 2011-182246 A | 9/2011 |

\* cited by examiner

SEMICONDUCTOR DEVICE

CROSS-REFERENCE TO RELATED APPLICATION

This application is based on, and claims priority to, Japanese Patent Application No. 2014-050501, filed on Mar. 13, 2014, contents of which are incorporated herein by reference.

BACKGROUND OF THE INVENTION

1. Field of the Invention

The present invention relates to a semiconductor device including a power semiconductor element for controlling a motor or solenoid valve, the semiconductor device allowing operation without thermal breakdown of a semiconductor element by parallel connection of two or more semiconductor devices corresponding to the current carrying capacity of a load, the semiconductor element being a power semiconductor element in each of the plurality of semiconductor devices.

2. Description of the Related Art

A technology is known as disclosed in Japanese Unexamined Patent Application Publication No. H06-151844 in which a circuit for compensating a gate threshold voltage is provided at a gate of a MOSFET to maintain the temperature characteristic of the apparent threshold voltage to be flat.

Japanese Unexamined Patent Application Publication No. H07-022515 discloses a semiconductor integrated circuit with no temperature variation in an output switching speed by reducing the temperature variation of the resistance of the whole of an output MOSFET using a high resistivity polycrystalline silicon exhibiting a negative temperature coefficient for the input wiring to the gate of the output MOSFET in order to compensate for a temperature variation of the switching speed due to a positive temperature coefficient of a resistance of the output MOSFET.

Japanese Unexamined Patent Application Publication No. H10-327056 discloses an insulated gate type semiconductor device, which is a MOS type field effect transistor element exhibiting a reduced temperature variation in an ON voltage using a Zener diode having a temperature characteristics of the Zener voltage that is complementary to the temperature characteristics of the gate threshold voltage of the MOS type field effect transistor.

Figure 5:
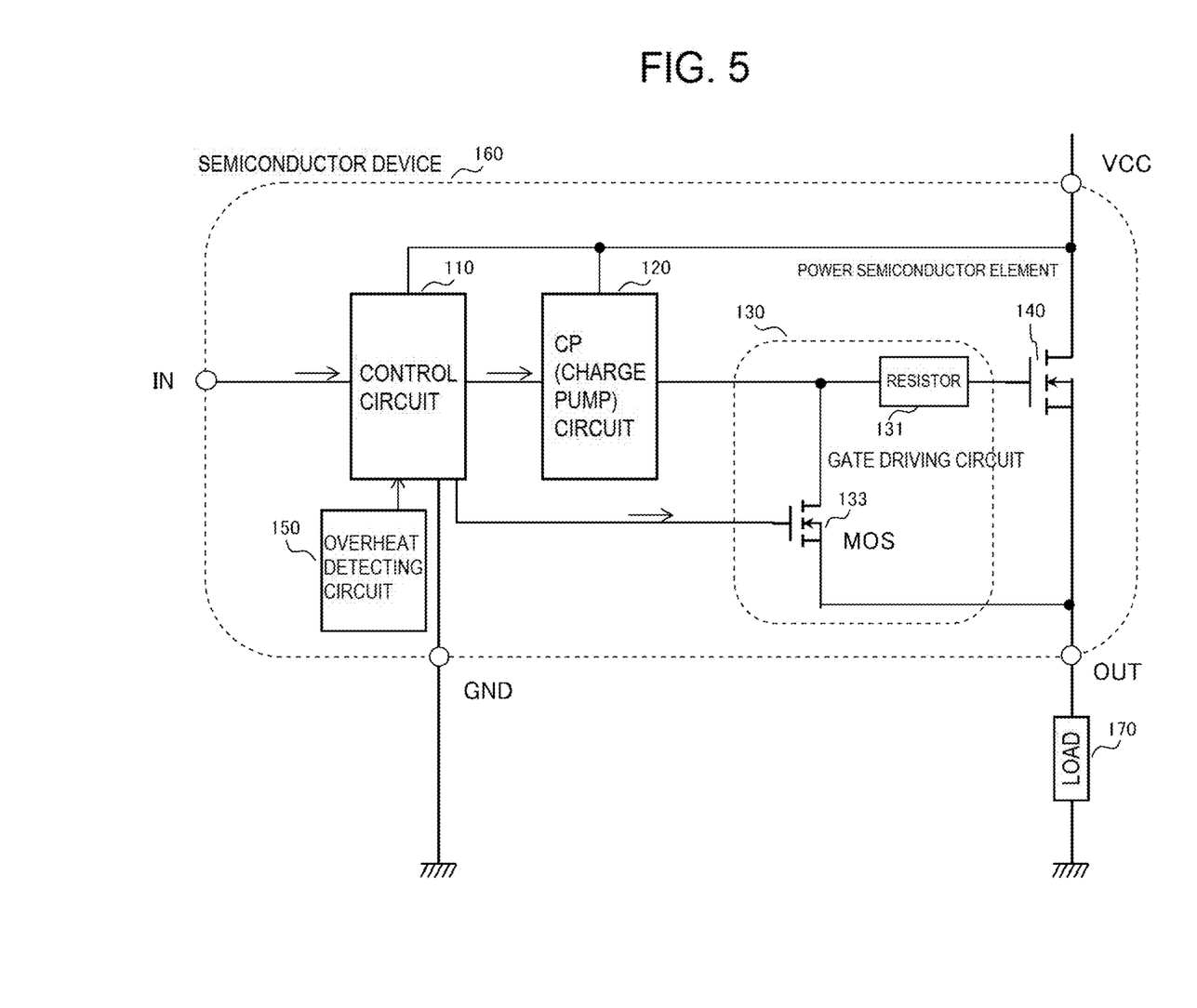
FIG. 5 shows a construction of a semiconductor device according to a conventional technology.

FIG. 5 shows a construction of a conventional semiconductor device. In the semiconductor device 160 of FIG. 5, a control circuit 110, according to the input signal to an IN terminal, controls a charge pump (CP) circuit 120, which raises a voltage up to a value higher than the power supply voltage VCC voltage. A gate driving circuit 130, receiving the output from the CP circuit 120, ensures turning ON of a power semiconductor element 140 through a resistor 131 connected between the CP circuit 120 and the gate of the power semiconductor element 140. For turning OFF of the power semiconductor element 140, a control signal delivered from the control circuit 110 stops the voltage raising operation of the CP circuit 120 and turns ON the MOS switch 133 in the gate driving circuit 130, thereby pulling down the gate voltage of the power semiconductor element 140 to the source potential of the power semiconductor element 140 to turn OFF the power semiconductor element 140.

In the semiconductor device of FIG. 5, the control circuit 110 turns ON/OFF the power semiconductor element 140 to control power supply to the load 170. When a heavy current runs through the load 170, the power semiconductor element 140 is of course heated by the current. Thus, in the event of the load being short circuited, the temperature of the power semiconductor element 140 rises above the guarantee temperature, which causes a protective mechanism provided in the semiconductor device 160 into operation to interrupt the current. Thus, the load 170 and the power semiconductor element 140 are protected. In order to reduce the frequency of operation of the protecting mechanism for the load 170 and the power semiconductor element 140, conventional power semiconductor elements 140 are designed and manufactured to have an effective area for current flow as small as possible in consideration of the load and environmental temperature within the range without a problem in actual operation. A power semiconductor element 140 with an excessively large size would invite increased cost and enlarged device scale.

The example of the conventional semiconductor device of FIG. 5 has a protection circuit of an over-heat detecting circuit 150. When the temperature of the power semiconductor element 140 rises to a predetermined value due to over-current in an event of load short-circuit, for example, the current through the power semiconductor element 140 is interrupted by turning ON the MOS switch 133 in the gate driving circuit 130 to avoid the thermal breakdown of the semiconductor device 160.

A protection circuit for the semiconductor device 140 can be any one of a dynamic clamp circuit, an over-current detecting circuit, and an over-voltage detecting circuit, as well as the over-heat detecting circuit 150 mentioned above.

For application to heavy current use in a conventional technology, the size of the power semiconductor element has to be increased. In addition, changes to the control circuit for controlling the power semiconductor element and in the size of the substrate of the chip and the size of the package (PKG) are needed, which leads to increasing costs and enlarging the device.

Figure 6A:
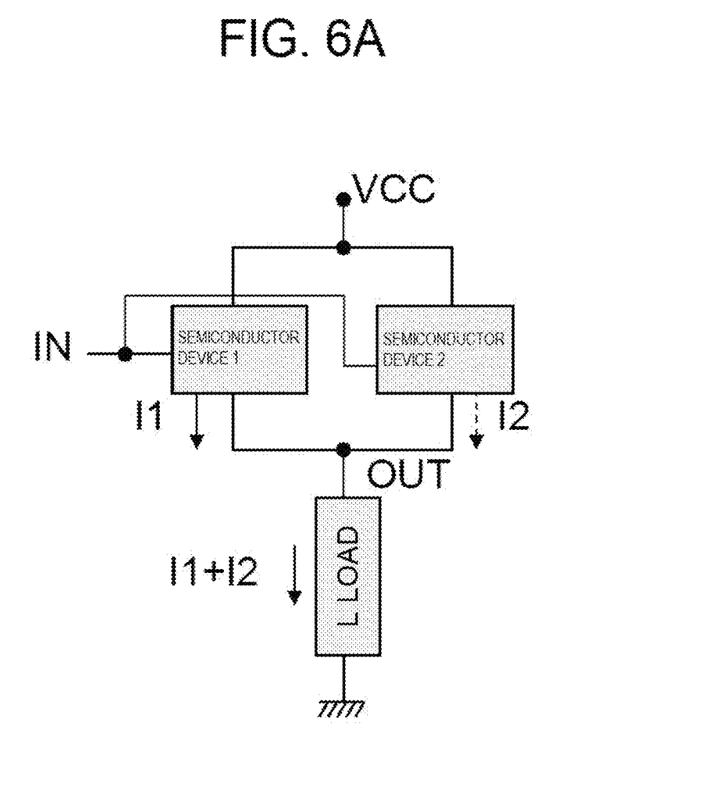
FIG. 6A shows a schematic construction of semiconductor devices parallel-connected for application to high current use according to a conventional technology.

When a plurality of semiconductor devices are connected in parallel for high current use as shown in FIG. 6A, imbalance in current between the devices may occur due to scattering in manufacturing conditions for the semiconductor devices and one of the semiconductor device exceeds a guarantee temperature, failing to perform a desired characteristics.

Figure 6B:
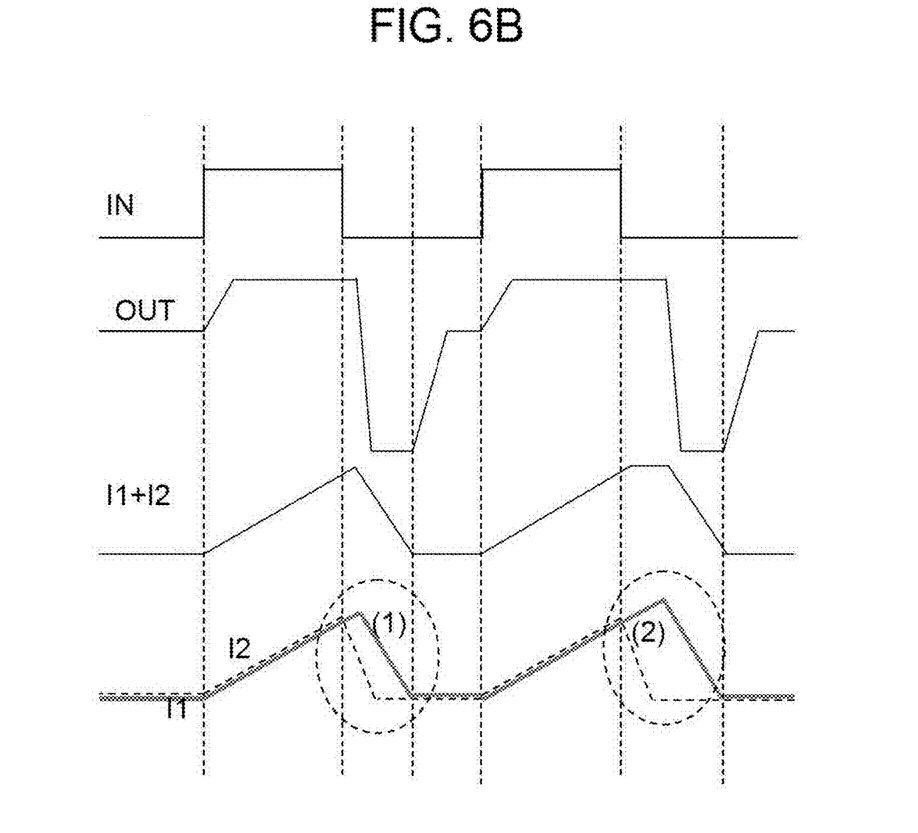
FIG. 6B shows the waveforms of some quantities in the construction depicted in FIG. 6A.

FIG. 6A shows a schematic construction of two conventional semiconductor devices parallel-connected for high current application. In FIG. 6A, the two semiconductor devices, a semiconductor device 1 and a semiconductor device 2, receive the same input signal IN at respective input terminals and are ON/OFF-driven continuously. FIG. 6B shows waveforms at some points including current waveforms in the two semiconductor devices in the case the switching OFF time Toff of the semiconductor device 1 is longer than the switching OFF time Toff of the semiconductor device 2. The switching OFF time Toff is a time period from the time when the input signal IN becomes a low level indicating turning OFF until the time when the semiconductor device actually turns OFF.

In the case the switching OFF time Toff of the semiconductor device 1 is longer than the switching OFF time Toff of the semiconductor device 2, as the waveforms at the lowest position in FIG. 6B indicate in the dashed ellipse, the semiconductor device 2 first turns OFF because the Toff of the semiconductor device 2 is shorter. The solid line at the bottom position in FIG. 2B represents the current I1 through the semiconductor device 1, and the dashed line represents the current I2 through the semiconductor device 2. Thus, the semiconductor device 1 has to treat excessively the energy stored in the inductive load (L load). When the ON/OFF operation is conducted continuously, because the temperature variation of the Toff due to heating of a power semiconductor element of a semiconductor device is generally positive, extending the Toff of the semiconductor device 1, the difference of the Toff increases as shown at the part (2) enclosed by the dashed ellipse after the power semiconductor element is heated in comparison with the part (1) enclosed by the dashed ellipse before heating. Repetition of that process raises the temperature of the semiconductor device 1 over the guarantee temperature and eventually makes a protection circuit provided in the semiconductor device operate to forcedly interrupt the operation of the power semiconductor element. Thus, the current balance cannot be maintained and even the parallel-connected plurality of semiconductor devices cannot be adapted to heavy current use. The load in FIG. 6A is an inductive load (L load) because the power semiconductor elements are supposed to control a motor or a solenoid valve.

Usually, a power semiconductor element tends to decrease carrier mobility at a higher temperature due to heating thereof, which reduces switching speed. Continuous ON/OFF operation may further disturb the current balance.

Even in the conventional construction as mentioned above, each semiconductor device has a protection circuit within the device, and a control circuit in each semiconductor device performs ON/OFF control of the power semiconductor element with the support of the protection mechanism of the protection circuit. The protection mechanism, however, does not keep current balance corresponding to the imbalance between the power semiconductor elements in a configuration of the plurality of semiconductor devices connected in parallel.

The conventional technologies disclosed in Japanese Unexamined Patent Application Publication No. H06-151844, Japanese Unexamined Patent Application Publication No. H07-022515 and Japanese Unexamined Patent Application Publication No. H10-327056 make apparent temperature characteristics of a switching element flat in combination with the temperature characteristic of other device elements. Because the flat temperature characteristic does not compensate for imbalance between the power semiconductor elements in the configuration composed of a plurality of power semiconductor elements connected in parallel, imbalance occurs in current, heating, and temperature rise. If temperature balance is destroyed between power semiconductor elements, a mobility balance is also upset, increasing the risk of imbalance due to positive feedback.

SUMMARY OF THE INVENTION

An important feature of the present invention is to compensate for imbalance between a plurality of semiconductor elements connected in parallel by establishing negative feedback to achieve a current balance utilizing reversed temperature characteristics without providing any dedicated device element for cancelling temperature characteristics in the circuit.

In order to achieve the above, an aspect of the present invention is a semiconductor device including: a control circuit, a power semiconductor element, and a gate driving circuit connected between the control circuit and the power semiconductor element, where the gate driving circuit has a resistor exhibiting a positive temperature characteristic of resistance value and a diode exhibiting a negative temperature characteristic of a forward voltage drop.

Another aspect of the present invention is a semiconductor device further including a booster circuit that applies a voltage elevated by the booster circuit to the gate driving circuit when the power semiconductor element is turned ON.

A further aspect of the present invention is a semiconductor device where the booster circuit is a charge pump circuit. A further aspect of the present invention is a semiconductor device where the anode of the diode has a forward voltage drop exhibiting a negative temperature characteristic and is connected to a gate of the power semiconductor element, and the cathode of the diode is connected to a MOS switch; and when the power semiconductor element is turned OFF, the control circuit stops operation of the booster circuit and turns the MOS switch ON.

A further aspect of the present invention is a semiconductor device including: a control circuit; a charge pump circuit driven by the control circuit; and a gate driving circuit that turns ON a power semiconductor element by applying a voltage elevated by the charge pump circuit to a gate driving circuit, and that turns OFF the semiconductor element by stopping operation of the charge pump circuit with a control signal delivered from the control circuit and by controlling a gate of a MOS switch in the gate driving circuit with a control signal from the control circuit to draw out charges on a gate of the power semiconductor element thereby turning OFF the power semiconductor element; where the gate driving circuit includes a resistor having a resistance value exhibiting a positive temperature characteristic and a diode having a forward voltage drop exhibiting a negative temperature characteristic, the resistor and the diode being connected in parallel and connected between the charge pump circuit and the gate of the power semiconductor element.

A further aspect of the present invention is a semiconductor device including a control circuit, a power semiconductor element, and a gate driving circuit connected between the control circuit and the power semiconductor element; where the gate driving circuit delays a control signal delivered from the control circuit to delay a turning ON time of the power semiconductor element when the power semiconductor element is at a relatively high temperature, and turns OFF the power semiconductor element inhibiting delay of the control signal delivered from the control circuit to rapidly operate the power semiconductor element.

A further aspect of the present invention is a semiconductor device including: a control circuit; a charge pump circuit driven by the control circuit; and a gate driving circuit that turns ON a power semiconductor element by applying a voltage elevated by the charge pump circuit to a gate driving circuit, and that turns OFF the semiconductor element by stopping operation of the charge pump circuit with a control signal delivered from the control circuit and by controlling a gate of a MOS switch in the gate driving circuit with a control signal from the control circuit to draw out charges on a gate of the power semiconductor element thereby turning OFF the power semiconductor element; where a charge pump function of the charge pump circuit is made to rise up slowly when the power semiconductor element is at a relatively high temperature.

A further aspect of the present invention is a semiconductor device where the resistor provided in the gate driving circuit is formed of polysilicon on an oxide film and exhibits a positive temperature characteristic of a resistance value thereof by increasing a resistivity with an adjusted doping amount, and formed within a substrate on which the control circuit or the power semiconductor element is provided.

A further aspect of the present invention is a semiconductor device where the power semiconductor element is turned ON at a relatively high temperature with a switching ON time Ton longer than a switching ON time Ton at a relatively low temperature, the switching ON time being adjusted by the control circuit.

A further aspect of the present invention is a semiconductor device where the power semiconductor element is turned OFF at a relatively high temperature with a switching OFF time Toff shorter than a switching OFF time Toff at a relatively low temperature, the switching OFF times Toff being adjusted by the control circuit.

Yet another aspect of the present invention is a semiconductor system comprising two or more semiconductor devices connected in parallel and continuously ON/OFF-driven with one and the same input signal.

According to the present invention, in a non-limiting example, compensation can be achieved for imbalance between a plurality of power semiconductor elements connected in parallel by establishing negative feedback to achieve current balance utilizing reversed temperature characteristics in a configuration with a plurality of semiconductor devices connected in parallel without providing any dedicated device element for cancelling temperature characteristics in the circuit.

According to the present invention, in a non-limiting example, when change of current carrying capacity of the load is needed, the above-described configuration of a plurality of semiconductor devices connected in parallel without changing the input signal allows response in a short period without redesigning the semiconductor device including change in area of a power semiconductor element for each required current carrying capacity. Thus, the semiconductor device of the invention is flexible to changes in current carrying capacity of the load.

DETAILED DESCRIPTION OF THE INVENTION

Some preferred embodiments of the present invention will be described in detail in the following with reference to the accompanying drawings.

Figure 1:
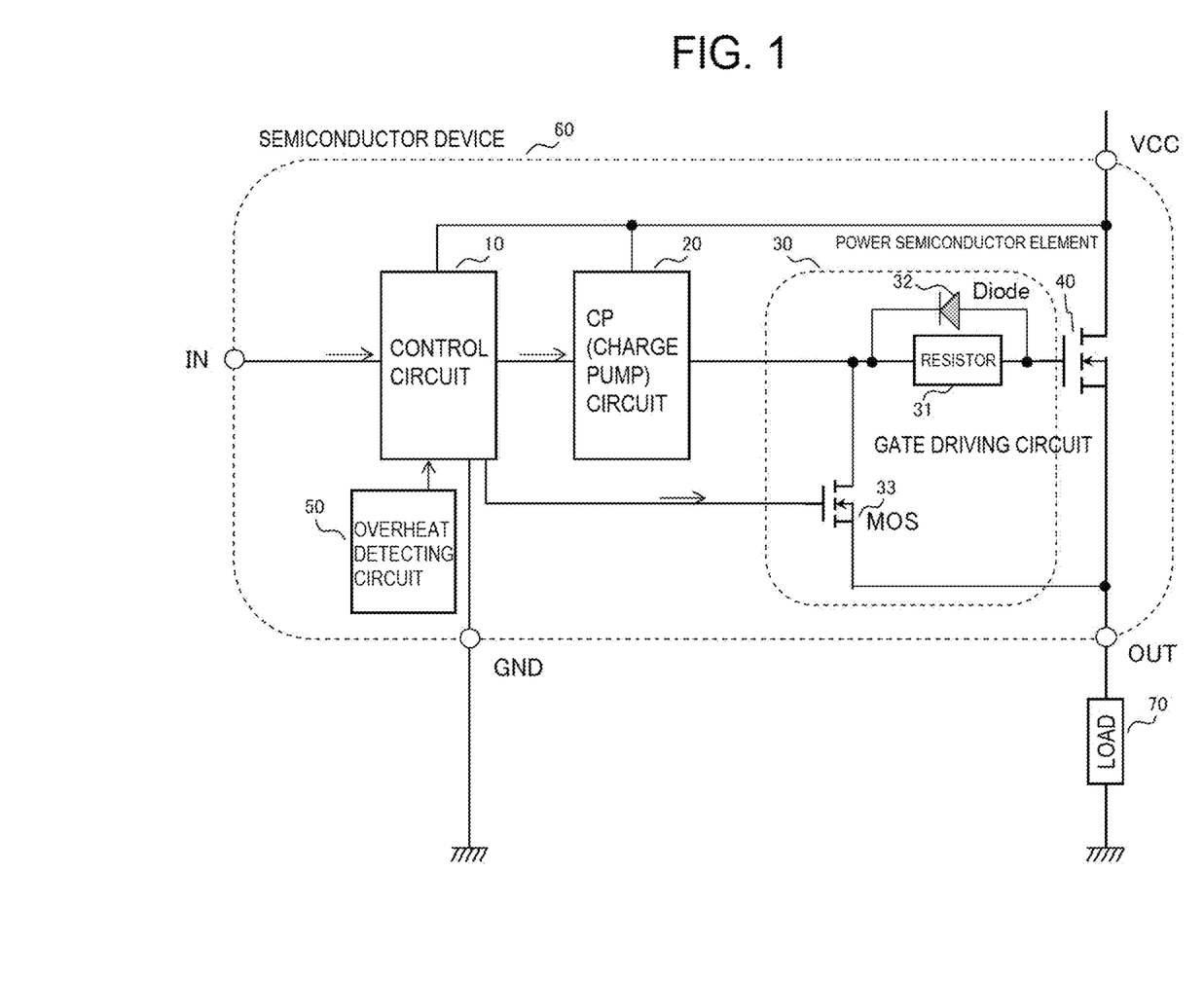
FIG. 1 shows a construction of a semiconductor device according to an embodiment of the present invention.

FIG. 1 shows a construction of a semiconductor device according to an embodiment of the present invention. In a semiconductor device 60 according to the embodiment of the present invention shown in FIG. 1, a control circuit 10 provided in the semiconductor device 60 gives a control signal to a voltage raising circuit of a charge pump (CP) circuit 20 according to an input signal given to an IN terminal. Although the CP circuit 20 is used for a voltage raising circuit here, the voltage raising circuit is not limited to the CP circuit 20, but a booster type switching regulator, for example, can be used as well. The CP circuit 20 upon receiving the control signal delivers a voltage raised up to a value higher than a power supply voltage of VCC voltage. A gate driving circuit 30 delivers a voltage raised by the CP circuit 20 to the gate of a power semiconductor element 40 through a resistor 31 connected between the CP circuit 20 and the power semiconductor element 40. Thus, the power semiconductor element 40 can be ensured to be turned ON.

To turn OFF the power semiconductor element 40, a control signal delivered by the control circuit 10 stops the voltage raising operation of the CP circuit 20, and the same or another control signal, the latter is the case shown in FIG. 1, delivered by the control circuit 10 drives a MOS switch 33 in the gate driving circuit 30. Upon switching ON the MOS switch 33 in the gate driving circuit 30, the gate voltage of the power semiconductor element 40 is pulled down to a source potential of the power semiconductor element 40, which means discharging the gate capacitance of the power semiconductor element 40 to ensure turning OFF of the power semiconductor element 40.

In the process of turning OFF the power semiconductor element 40, because a diode 32 is provided in parallel to the resistor 31 in a gate driving circuit 30 connected between the CP circuit 20 and the gate of the power semiconductor element 40, the charge on the gate capacitance of the power semiconductor element 40 is fast discharged through the diode 32. The resistor 31 has a positive temperature characteristic of the resistance value thereof, and the diode 32 has a negative temperature characteristic of a forward voltage drop thereof. These properties are utilized as described later.

The resistor 31 provided in the gate driving circuit 30 of the semiconductor device 60 is produced by processing a polysilicon film on an oxide film in a step in manufacturing the semiconductor device 60. The positive temperature characteristic can be achieved increasing the resistivity by adjusting a doping amount of the polysilicon film with an impurity. The resistor 31 can be formed in the same substrate containing the control circuit 10 or the power semiconductor element 40.

Figure 2:
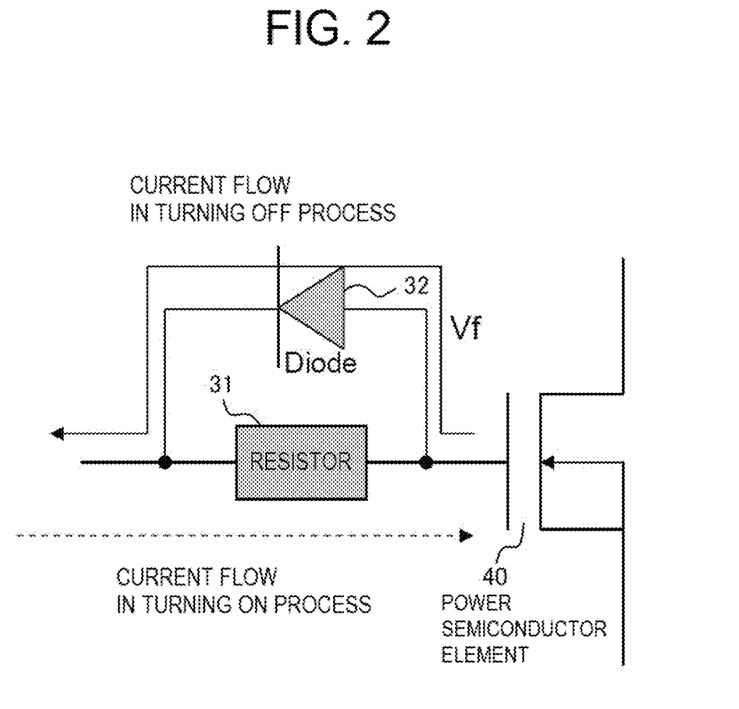
FIG. 2 shows a construction of an essential part of a gate driving circuit of a semiconductor device according to an embodiment of the present invention.
Figure 3:
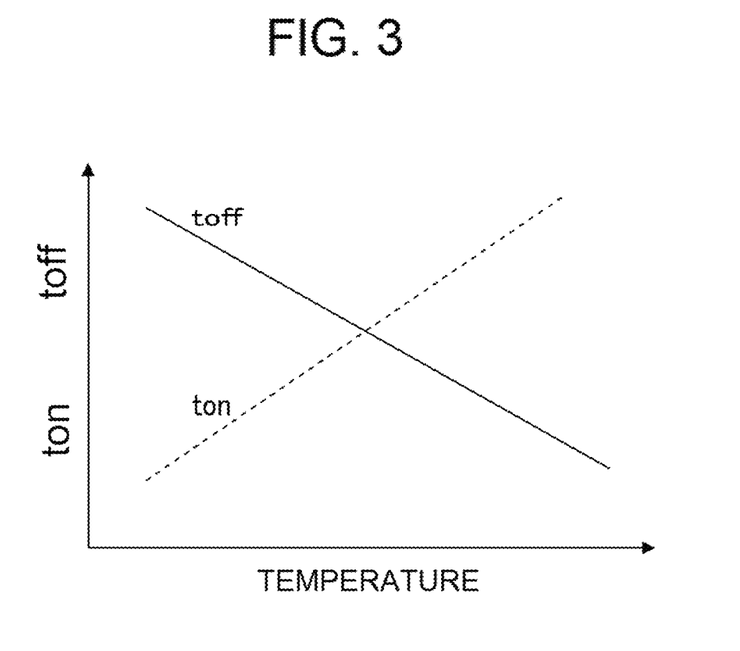
FIG. 3 shows temperature characteristics for turning ON and OFF of a power semiconductor element of a semiconductor device according to an embodiment of the present invention.

FIG. 2 shows a construction of an essential part of a gate driving circuit of a semiconductor device according to an embodiment of the present invention. When the power semiconductor element 40 turns ON, a current flows into the gate of the power semiconductor element 40 through the resistor 31 as shown in FIG. 2. When the power semiconductor element 40 turns OFF, a forward voltage is applied to the diode 32 shown in FIG. 2 so that the charge on the gate capacitance (not depicted in FIG. 2) of the power semiconductor element 40 flows as a discharging current through the diode 32. Even though a current imbalance is generated in the current flowing in the process of turning ON or turning OFF of the power semiconductor element 40 due to scattering in manufacturing process of the power semiconductor element, current balance can be maintained between the semiconductor devices of the invention as explained in the following. Because the power semiconductor element 40 turns ON through the resistor 31 having a positive temperature characteristic of the resistance value, charging on the gate of the power semiconductor element 40 is delayed at higher temperatures. Thus, the turning ON time of the power semiconductor element 40 is extended as shown in FIG. 3. On the other hand, because the power semiconductor element 40 is turned OFF fast through the diode 32 exhibiting a negative temperature characteristic of the forward voltage drop, the turning OFF time of the power semiconductor element 40 is shortened at higher temperatures, which leads to lowering the temperature. Thus, temperature fluctuation can be settled. The provision of the parallel-connected resistor 31 and diode 32 smoothes the temperature fluctuation in the processes of turning ON and OFF of the power semiconductor element 40, so that the current balance can be also held.

Other means for obtaining the temperature characteristics as described above can be as follows. In the turning ON process of the power semiconductor element 40 at a high temperature, the control signal from the control circuit 10 to the control circuit 10 can be delayed, or the capability of the charge pump of the CP circuit 20 can be delayed. In the turning OFF process of the power semiconductor element 40 at a high temperature, the delay of the control signal delivered from the control circuit 10 is cancelled and at the same time, the MOS switch 33 in the gate driving circuit 30 is operated at a high speed, smoothing the temperature fluctuation in the ON and OFF processes of the power semiconductor element 40 like the case described earlier. (See the waveform depicted in the ellipse with broken curve in FIG. 4B.)

In the semiconductor device according the embodiment of the invention, the temperature characteristics as shown in FIG. 3 are given to the resistor 31 and the diode 32 connected in parallel in the gate driving circuit 30 to delay the turning ON of the power semiconductor element 40, which is a charging process to the gate capacitance of the power semiconductor element 40, and to hasten the turning OFF of the power semiconductor element 40, which is a discharging process from the gate capacitance of the power semiconductor element power semiconductor element 40 at a relatively high temperature. Therefore, the temperature fluctuation is compensated in the turning ON and OFF processes of the power semiconductor element 40.

Using the gate driving circuit 30 shown in FIG. 2 or a gate driving circuit equivalent to the gate driving circuit 30 of FIG. 2, a switching ON time Ton of the power semiconductor element 40 is such that Ton at a low temperature<Ton at a high temperature, the Ton being a time period after an issue of turning ON command by a control signal until the power semiconductor element 40 actually turns ON, and a switching OFF time Toff of the power semiconductor element 40 is such that Toff at a low temperature>Toff at a high temperature, the Toff being a time period after an issue of turning OFF command by a control signal until the power semiconductor element 40 actually turns OFF. In a case a plurality of semiconductor devices connected in parallel are used for application to a high current use, too, a semiconductor device that tends to over-heating due to scattering in manufacturing factors is adjusted to delay the rising up process and hasten the falling down process, thereby burdening a semiconductor device at a relatively low temperature with the current. Thus, thermal bias between the semiconductor devices can be balanced. More details will be described afterward.

FIG. 3 shows temperature characteristics for turning ON and OFF of a power semiconductor element of a semiconductor device according to an embodiment of the present invention. As described earlier, the gate voltage of the power semiconductor element 40 rises up slowly at a high temperature through the resistor 31 exhibiting a positive temperature characteristic of a resistance value, and the gate voltage of the power semiconductor element 40 falls down quickly at a high temperature through the diode 32 exhibiting a negative temperature characteristic of a forward voltage drop, Because the forward voltage drop of the diode in the discharging path is lower at a higher temperature, the charges accumulated on the gate capacitance of the power semiconductor element 40 are discharged more easily. As the temperature is lowered by shortening the current running time period through the power semiconductor element 40 at a high temperature, temperature fluctuation is smoothed and current balance is maintained.

When the control circuit 10 shown in FIG. 1 turns ON the power semiconductor element 40 at a high temperature observing the temperature condition of the power semiconductor element 40 by means of a protective circuit (not shown in FIG. 1) such as an over-current detecting circuit and an over-voltage detecting circuit, for example, as well as the overheating detecting circuit 50 depicted in FIG. 1, the switching ON time Ton at a high temperature is made longer than the switching ON time Ton at a low temperature. When the power semiconductor element 40 is turned OFF at a high temperature, the switching OFF time Toff at a high temperature is made shorter than the switching OFF time Toff at a low temperature. Thus, the current balance can be held by means of other methods than the one indicated in FIG. 1.

Figure 4A:
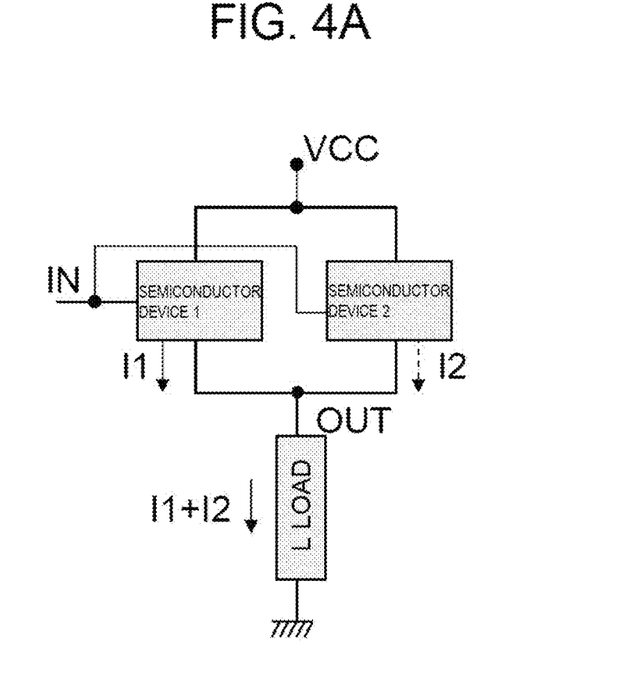
FIG. 4A shows a schematic construction of semiconductor devices parallel-connected for application to high current use in a semiconductor system according to an embodiment of the present invention.
Figure 4B:
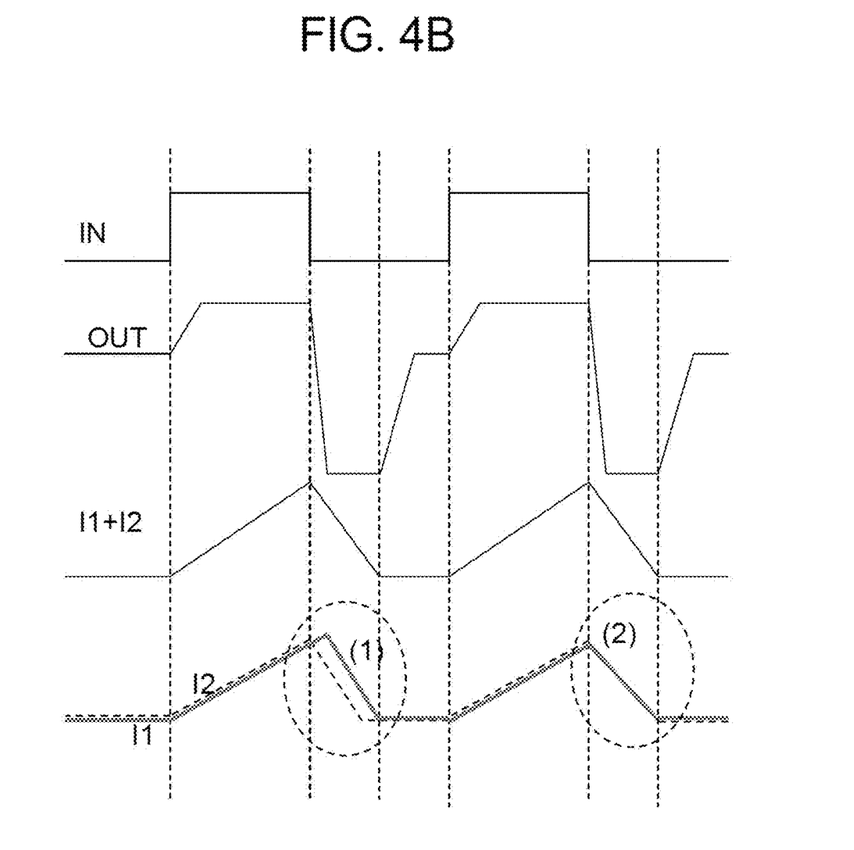
FIG. 4B shows the waveforms of some quantities in the construction depicted in FIG. 4A.

FIG. 4A shows a schematic construction of semiconductor devices according to an embodiment of the invention parallel-connected for application to high current use according to an embodiment of the present invention. The two semiconductor devices, semiconductor device 1 and semiconductor device 2, are connected in parallel and each of the parallel-connected semiconductor devices receives the same input signal IN at the input terminal of the respective semiconductor devices, and the two semiconductor devices are continuously ON/OFF-driven. FIG. 4B shows the waveforms of some quantities in the construction including the two semiconductor devices connected in parallel in the case the switching OFF time Toff of the semiconductor device 1 is longer than the switching OFF time Toff of the semiconductor device 2. In the waveforms indicated at the bottom of FIG. 4B, the solid line represents the current I1 flowing in the semiconductor device 1, and the dashed line represents the current I2 flowing in the semiconductor device 2.

In the embodiment example as shown in FIG. 2, the gate driving circuit 30 has a diode 32 exhibiting a negative temperature characteristic in the time of Toff. Thus, current balance at the time encircled with the broken ellipse (1) indicated in FIG. 4B for the embodiment example does not so disturbed as the corresponding waveform encircled with the broken ellipse (1) indicated in FIG. 6B for the conventional example. In the waveform encircled by the dashed ellipses (2) of FIG. 4B, the current balance between the semiconductor device 1 and the semiconductor device 2 is held because the Toff of the semiconductor device 1 is made short. The current balance allows an operation within a guarantee temperature for both the semiconductor device 1 and the semiconductor device 2. Though not explained, in the process of Ton, too, it is understood that although the current balance is a little disturbed before reaching the part encircled by the dashed ellipse (1), current balance is established at just before the part encircled by the dashed ellipse (2).

In the application to high current use with the semiconductor devices according to the embodiments of the present invention connected in parallel, one of the semiconductor devices may be more vulnerable to overheating due to scattering in manufacturing factors, generating imbalance between the current flowing in the power semiconductor elements. However, in the non-limiting example of the preferred embodiment, the turning ON process of the power semiconductor element of the semiconductor device 1 at a higher temperature is slower and the turning OFF process of the power semiconductor element of the semiconductor device 1 at a higher temperature is faster. As a result, the power semiconductor element of the semiconductor device 2 at a low temperature burdens more current, smoothing the temperature fluctuation of the semiconductor devices connected in parallel and maintaining the current balance. The current balance balances the heat generation of the semiconductor devices connected in parallel, so that the total amount of current of n times of the current of one semiconductor device can be flown in the load, wherein the number n is the number of devices in parallel connection. In FIG. 4A, the power semiconductor elements are also supposed to control motors and solenoid valves and the load is an inductive load (L load).

As described thus far, according to a non-limiting example of the present invention, compensation can be achieved for imbalance between a plurality of power semiconductor elements connected in parallel by establishing negative feedback to achieve current balance utilizing reversed temperature characteristics in a configuration with a plurality of semiconductor devices connected in parallel without providing any dedicated element in a circuit for cancelling temperature characteristics, whereas such a dedicated element is disclosed in Japanese Unexamined Patent Application Publication No. H06-151844, Japanese Unexamined Patent Application Publication No. H07-022515 and Japanese Unexamined Patent Application Publication No. H10-327056.

The non-limiting example of the preferred embodiment of the invention above describes exclusively a power semiconductor element disposed on the high or positive side to avoid current imbalance due to variations in the manufacturing process. However, the technology of the present invention can be applied to power semiconductor elements disposed on the low or negative side.

What is claimed is:

1. A semiconductor system comprising:
two or more semiconductor devices connected in parallel and configured to be continuously ON/OFF-driven with a common input signal, each semiconductor device including:
a control circuit;
a power semiconductor element; and
a gate driving circuit connected between the control circuit and the power semiconductor element, the gate driving circuit further including:
a resistor having a resistance value exhibiting a positive temperature characteristic;
a diode having a forward voltage drop exhibiting a negative temperature characteristic; and
a metal-oxide semiconductor (MOS) switch connected to the diode and the resistor,
wherein the resistor and the diode are connected in parallel with each other, and
wherein upon switching ON of the MOS switch, a gate voltage of the power semiconductor element is pulled down to a source potential of the power semiconductor element, to thereby turn OFF the power semiconductor element,
wherein the positive temperature characteristic of the resistor and the negative temperature characteristic of the diode in each of the semiconductor devices are so set as to balance thermal biases and current drains between the two or more semiconductor devices,
wherein in each semiconductor device, the MOS switch is in direct electrical connection with a cathode of the diode, and
wherein the MOS switches of the gate driving circuits of the two or more semiconductor devices are switched ON and OFF in response to a common input signal to the two or more semiconductor devices.

2. The semiconductor system according to claim 1, said each semiconductor device further comprising a booster circuit that applies a voltage elevated by the booster circuit to an input of the gate driving circuit when the power semiconductor element is turned ON.

3. The semiconductor system according to claim 2, said each semiconductor device further comprising a substrate, wherein in each said device
the resistor is formed of polysilicon on an oxide film, and
the resistor exhibits a resistivity increasing with an increased doping amount.

4. The semiconductor system according to claim 2, wherein the booster circuit is a charge pump circuit.

5. The semiconductor system according to claim 2, wherein in each said device
an anode of the diode is connected to a gate of the power semiconductor element,
a cathode of the diode is connected to the MOS switch; and
when the power semiconductor element is turned OFF, the control circuit stops operation of the booster circuit and turns the MOS switch ON.

6. The semiconductor system according to claim 5, wherein a voltage of the charge pump circuit is made to rise up slowly when the power semiconductor element is at a relatively high temperature.

7. The semiconductor system according to claim 5, wherein the booster circuit is a charge pump circuit.

8. The semiconductor device system according to claim 2, said each semiconductor device further comprising a MOS switch, wherein
an anode of the diode is connected to a gate of the power semiconductor element,
a cathode of the diode is connected to the MOS switch; and
when the power semiconductor element is turned OFF, the control circuit stops operation of the booster circuit and turns the MOS switch ON.

9. The semiconductor system according to claim 1, said each semiconductor device further comprising a substrate, wherein in each said device
the resistor is formed of polysilicon on an oxide film, and
the resistor exhibits a resistivity increasing with an increased doping amount.

10. The semiconductor system according to claim 1, wherein in each said device the power semiconductor element is turned ON at a relatively high temperature with a switching ON time Ton longer than a switching ON time Ton at a relatively low temperature.

11. The semiconductor system according to claim 1, wherein in each said device the power semiconductor element is turned OFF at a relatively high temperature with a switching OFF time Toff shorter than a switching OFF time Toff at a relatively low temperature, the switching OFF times Toff being adjusted by the control circuit.

12. The semiconductor system according to claim 1, wherein in each said device the gate driving circuit delays a control signal delivered from the control circuit to delay a turning ON time of the power semiconductor element when the power semiconductor element is at a relatively high temperature, and turns OFF the power semiconductor element inhibiting delay of the control signal delivered from the control circuit to rapidly operate the power semiconductor element.

13. A semiconductor system comprising:
two or more semiconductor devices connected in parallel and configured to be continuously ON/OFF-driven with a common input signal, each semiconductor device including:
a control circuit;
a power semiconductor element;
a gate driving circuit connected between the control circuit and the power semiconductor element, the gate driving circuit further including:
a metal-oxide semiconductor (MOS) switch;
a resistor having a resistance value exhibiting a positive temperature characteristic; and
a diode having a forward voltage drop exhibiting a negative temperature characteristic; and
a booster circuit that applies a voltage elevated by the booster circuit to an input of the gate driving circuit when the power semiconductor element is turned ON,
wherein the booster circuit is a charge pump circuit,
wherein in each semiconductor device, the resistor and the diode are connected in parallel with each other, and the positive temperature characteristic of the resistor and the negative temperature characteristic of the diode therein are so set as to balance current drain between the two or more semiconductor devices,
wherein in each semiconductor device, the gate driving circuit turns ON the power semiconductor element by applying a voltage elevated by the charge pump circuit to the gate driving circuit, and that turns OFF the semiconductor element by stopping operation of the charge pump circuit with a control signal delivered from the control circuit and by controlling a gate of the MOS switch with a control signal from the control circuit to draw out charges on a gate of the power semiconductor element thereby turning OFF the power semiconductor element,
wherein each semiconductor device is turned off for less time as a temperature of said each semiconductor device increases, to balance thermal biases and current drains between the two or more semiconductor devices,
wherein in each semiconductor device, upon switching ON of the MOS switch, a gate voltage of the power semiconductor element is pulled down to a source potential of the power semiconductor element, to thereby turn OFF the power semiconductor element,
wherein in each semiconductor device, the MOS switch is in direct electrical connection with a cathode of the diode, and
wherein the MOS switches of the gate driving circuits of the two or more semiconductor devices are switched ON and OFF in response to a common input signal to the two or more semiconductor devices.

14. The semiconductor system according to claim 13, said each semiconductor device further comprising a substrate, wherein in each said device
the resistor is formed of polysilicon on an oxide film, and
the resistor exhibits a resistivity increasing with an increased doping amount.

15. The semiconductor system according to claim 13, wherein a voltage of the charge pump circuit in each said device is made to rise up slowly when the power semiconductor element is at a relatively high temperature.

16. The semiconductor system according to claim 13, wherein in each said device the power semiconductor element is turned ON at a relatively high temperature with a switching ON time Ton longer than a switching ON time Ton at a relatively low temperature.

17. The semiconductor system according to claim 13, wherein in each said device the gate driving circuit delays a control signal delivered from the control circuit to delay a turning ON time of the power semiconductor element when the power semiconductor element is at a relatively high temperature, and turns OFF the power semiconductor element inhibiting delay of the control signal delivered from the control circuit to rapidly operate the power semiconductor element.

18. A semiconductor system comprising:
two or more semiconductor devices connected in parallel and configured to be continuously ON/OFF-driven with a common input signal, each semiconductor device including:
a control circuit;
a power semiconductor element; and
a gate driving circuit connected between the control circuit and the power semiconductor element, the gate driving circuit further including:
a first element employed in turning on the power semiconductor element, the first element having an effective impedance value exhibiting a positive temperature characteristic;
a second element employed in turning off the power semiconductor element, the second element having an effective impedance value exhibiting a negative temperature characteristic, the second element having a diode and a cathode; and
a metal-oxide semiconductor (MOS) switch connected to the first and second elements,
wherein upon switching ON of the MOS switch, a gate voltage of the power semiconductor element is pulled down to a source potential of the power semiconductor element, to thereby turn OFF the power semiconductor element,
wherein the positive temperature characteristic of the first element and the negative temperature characteristic of the second element in each of the semiconductor devices are so set as to balance thermal biases and current drains between the two or more semiconductor devices,
wherein in each semiconductor device, the MOS switch is in direct electrical connection with the cathode of the second element, and
wherein the MOS switches of the gate driving circuits of the two or more semiconductor devices are switched ON and OFF in response to a common input signal to the two or more semiconductor devices.

* * * * *